United States Patent
Szczypinski et al.

(10) Patent No.: US 9,153,297 B2
(45) Date of Patent: Oct. 6, 2015

(54) INTEGRATED CIRCUIT AND METHOD FOR MANUFACTURING THE SAME

(75) Inventors: Kazimierz Szczypinski, Munich (DE); Wen-Ming Lee, Munich (DE)

(73) Assignee: Infineon Technologies AG, Neubiberg (DE)

( * ) Notice: Subject to any disclaimer, the term of this patent is extended or adjusted under 35 U.S.C. 154(b) by 985 days.

(21) Appl. No.: 12/061,812

(22) Filed: Apr. 3, 2008

(65) Prior Publication Data

US 2009/0251206 A1   Oct. 8, 2009

(51) Int. Cl.
*H03K 3/00* (2006.01)
*G11C 7/10* (2006.01)
*G11C 11/4093* (2006.01)

(52) U.S. Cl.
CPC ............ *G11C 7/1051* (2013.01); *G11C 7/1057* (2013.01); *G11C 7/1078* (2013.01); *G11C 7/1084* (2013.01); *G11C 11/4093* (2013.01)

(58) Field of Classification Search
None
See application file for complete search history.

(56) References Cited

U.S. PATENT DOCUMENTS

| | | | | |
|---|---|---|---|---|
| 5,235,335 A * | 8/1993 | Hester et al. | ................... | 341/172 |
| 5,742,183 A * | 4/1998 | Kuroda | ..................... | 326/81 |
| 6,310,506 B1* | 10/2001 | Brown | ........................ | 327/284 |
| 6,462,597 B2* | 10/2002 | Lee | ................ | 327/261 |
| 6,778,007 B2* | 8/2004 | Lim | ..................... | 327/541 |
| 7,075,355 B2* | 7/2006 | Furuie et al. | ................... | 327/434 |
| 7,570,102 B2* | 8/2009 | Tai | ................ | 327/434 |
| 2001/0043093 A1* | 11/2001 | Sakura et al. | ................. | 327/108 |
| 2005/0017767 A1* | 1/2005 | Huang et al. | .................. | 327/110 |
| 2008/0024206 A1* | 1/2008 | Murata et al. | ................... | 327/551 |
| 2008/0042696 A1* | 2/2008 | Redoute et al. | ................ | 327/108 |
| 2008/0048736 A1* | 2/2008 | Ruy | ............................. | 327/108 |
| 2009/0051347 A1* | 2/2009 | Ochiai et al. | ............... | 324/76.54 |

* cited by examiner

*Primary Examiner* — Lincoln Donovan
*Assistant Examiner* — Khareem E Almo
(74) *Attorney, Agent, or Firm* — Patterson & Sheridan, LLP

(57) ABSTRACT

An integrated circuit comprising at least one signal path which is adapted to route at least one signal from an origin to a target block, said signal path comprising at least an adjustable driver circuit comprising an input and an output, which is adapted to receive an electric signal having a first signal power as an input signal and which is adapted to provide an electric signal having a second signal power as an output signal is provided. Furthermore, the integrated circuit comprises at least one interconnect having an ohmic resistance and an electric capacity and being adapted to route said electric signal having a second signal power to said target block. Furthermore, a method for manufacturing such an integrated circuit is provided.

20 Claims, 3 Drawing Sheets

INTEGRATED CIRCUIT AND METHOD FOR MANUFACTURING THE SAME

BACKGROUND OF THE INVENTION

Generally, signal paths connect an origin and a target block in order to route an analog or digital signal from the origin to the target block. Said signal may comprise a clock signal, a data signal, a command signal, an address or the like. Usually, the signal path, the origin and the target block are integrated monolithically on the same semiconductor die.

BRIEF DESCRIPTION OF THE DRAWINGS

For a more complete understanding of the present invention and the advantages thereof, reference is made to the description taken in conjunction with the accompanying drawings in which.

DETAILED DESCRIPTION OF THE PREFERRED EMBODIMENT

Figure 1:
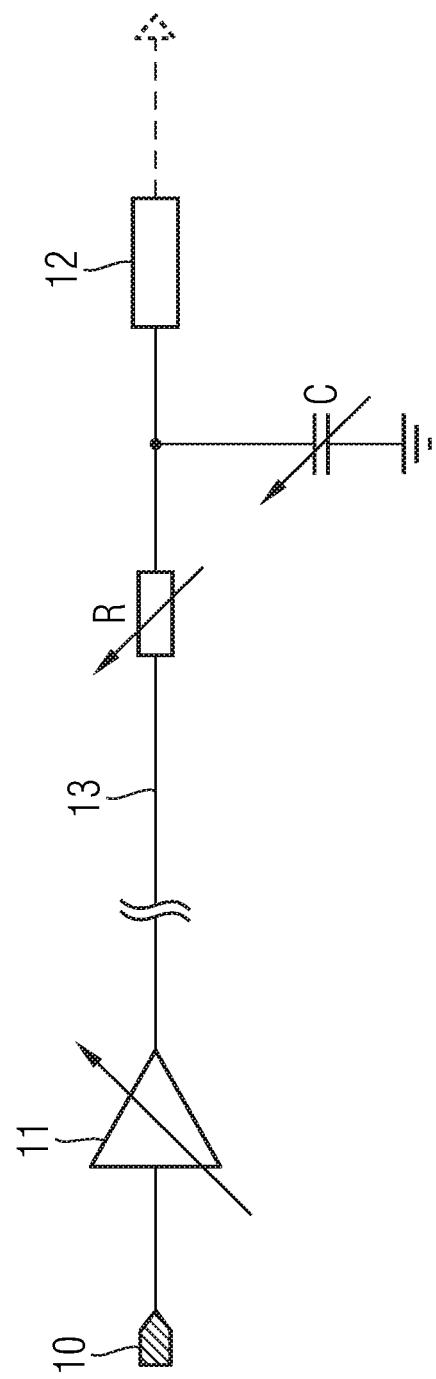
FIG. 1 shows a schematic diagram according to an embodiment.

Reference throughout the specification to "one embodiment" means that a particular feature, structure or characteristic described in connection with the embodiment is included in at least one embodiment of the present invention. Thus, the appearance of the phrases "in one embodiment" in various places throughout this specification are not necessarily all referring to the same embodiment. Furthermore, the particular features, structures or characteristics may be combined in any suitable manner in order to create more embodiments.

The invention relates to an integrated circuit comprising at least one signal path which is adapted to route at least one signal from an origin to a target block.

In one embodiment, the invention relates to an integrated circuit comprising at least one signal path which is adapted to route at least one signal from an origin to a target block. The signal path includes at least an adjustable driver circuit comprising an input and an output, which is adapted to receive an electric signal having a first signal power as an input signal and which is adapted to provide an electric signal having a second signal power as an output signal. Furthermore, the integrated circuit comprises at least one interconnect having an ohmic resistance and an electric capacity and being adapted to route the electric signal having a second signal power to the target block.

In another implementation, the invention relates to an integrated circuit comprising at least one signal path which is adapted to route at least one signal from an origin to a target block. The signal path includes at least one adjustable driver circuit comprising an input and an output, which is adapted to receive an electric signal having a first signal power as an input signal and which is adapted to provide an electric signal having a second signal power as an output signal. The adjustable driver circuit comprises at least two amplifiers which are arranged in parallel. The output signal of each of the amplifiers is coupled to an interconnect and at least one of the at least two parallel amplifiers is detachable from the interconnect by means of a fuse element. Furthermore, the integrated circuit according to this implementation comprises at least one interconnect having an ohmic resistance and an electric capacity and being adapted to route the electric signal having a second signal power to the target block.

In still another embodiment, the invention relates to a method for manufacturing an integrated circuit. The method includes the step of providing at least one semiconductor substrate. Subsequently, an adjustable driver circuit comprising an input and an output is formed on the substrate, wherein the driver circuit is adapted to receive an electric signal having a first signal power as an input signal and which is adapted to provide an electric signal having a second signal power as an output signal. At least one target block comprising at least one signal input is formed on the substrate also, as well as at least one interconnect having an ohmic resistance and an electric capacity and extending at least from the output of the driver circuit to the input of the target block.

In another implementation, the invention relates to a method for manufacturing an integrated circuit. The method includes the step of providing at least one semiconductor substrate. An adjustable driver circuit comprising an input and an output is formed on the substrate, wherein the driver circuit is adapted to receive an electric signal having a first signal power as an input signal and to provide an electric signal having a second signal power as an output signal. The driver circuit comprises a multitude of amplifiers which are arranged in parallel and the output signals of each of said amplifiers are coupled to an interconnect. In order to adjust the amplification, at least one amplifier out of the multitude of amplifiers is coupled to the interconnect by means of a fuse element. At least one target block comprising at least one signal input is provided on the substrate. At least one interconnect having an ohmic resistance and an electric capacity and extending at least from an output of the driver circuit to the input of the target block, is formed on the substrate. Finally, at least one fuse element is broken in order to adjust a signal delay on the interconnect.

The basic principle of the invention is explained with respect to FIG. 1.

FIG. 1 shows a signal path as part of an integrated circuit according to an embodiment. The integrated circuit may comprise digital or analog electronics. As an example, the integrated circuit may comprise a digital memory such as a DRAM-, SRAM- or FLASH-EEPROM-memory. In another embodiment, the integrated circuit may comprise a microcontroller, a microprocessor, a digital signal processor or the like.

In any case the integrated circuit may comprise a plurality of functional blocks in order to perform the desired function, such as an arithmetic and logic unit or memory cells. During operation of the integrated circuit, signals representing commands, data, addresses, clock cycles or the like may be exchanged between the plurality of functional blocks 12. Therefore, a plurality of signal paths is provided on an integrated circuit.

One example for a signal path is illustrated in FIG. 1. A signal starts from an origin 10. The origin may comprise a functional block or a contact pad which can be used to deliver a signal from an external signal source to the integrated circuit.

The signal may be intended to be lead by an interconnect 13 to a target block 12. The interconnect 13 can be made from a conductive material such as polycrystalline silicon, a metal or an alloy.

Usually, any interconnect has an intrinsic resistance R and an intrinsic capacity or capacitance C. These intrinsic resistances and capacities are delocalized over the length of the interconnect. For illustrative purposes only, a resistor and a capacitor are shown in FIG. 1 as discrete elements in order to represent the intrinsic resistance R and an intrinsic capacity C of the interconnect 13.

The resistance and the capacity are responsible for a signal-delay between the starting point at origin 10 and the target block 12.

Furthermore, a line driver 11 is provided. Driver 11 may be used to adjust the current and/or the voltage of the signal received from origin 10. Because the product of the current and the voltage of an electric signal equals the electric power of the signal, the adjustment of a current and/or a voltage of the signal is referred to as adjustment of the signal power. The signal power may be increased either by increasing the signal voltage or by increasing the electric current of the signal or by changing both values.

Increasing the signal power may have at least two effects on the signal. As a first aspect, increasing the signal power may be necessary to compensate for losses caused by resistance R. If these losses exceed a certain value, the signal may degrade to an extent that it is not useable by the target block 12. In another aspect, the power of an alternating signal may be used to charge and de-charge the capacity C of the interconnect 13. Therefore, the signal power may also influence the signal delay when traveling from origin 10 to target block 12.

Usually, a plurality of target blocks 12 and/or a plurality of signal sources 10 is arranged on an integrated circuit. In this case, the timing of different signals traveling over different signal paths 13 may be crucial. If two different target blocks 12 should operate at the same time, a clock signal may be supplied to both target blocks 12. Thus, the signal delay in each interconnect 13 may be the same in case both signal paths 13 have the same length. In case that one signal path is shorter than the other signal path, the signal delay in the shorter path may be increased. By this measure, the clock signal may arrive at every target block 12 at the same time.

In another example, two target blocks 12 may operate one after the other. In this case, a signal delay on both signal paths can be adjusted to perform operation of both target blocks 12 with a predetermined delay.

In order to adjust the delay of a signal path 13, the signal power may be adjusted by changing the design of the driver circuit 11. In another embodiment, the resistance of the interconnect may be adjusted. In still another embodiment, the capacitance of the interconnect may be adjusted. In still another embodiment, at least two out of the three above parameters may be adjusted in order to allow the signal delay to hit a predetermined value.

The signal power delivered by a driver circuit 11 may be increased by increasing the width of the semiconductor structure which results in an increase of the signal power. The semiconductor structure may comprise a field-effect transistor, a bipolar transistor or a plurality of transistors. As the semiconductor structure used for the task of amplification becomes broader, the current and hence the power of the signal increases.

The resistance of interconnect 13 may be influenced by changing the specific resistance of the material from which the conductive interconnect 13 is made. As an example, the interconnect may be made from polycrystalline silicon, from a metal or from an alloy. The resistance of a polycrystalline silicon interconnect may be influenced by different doping levels. The resistance of an interconnect made from a metal or an alloy may be influenced by changing the elemental composition.

Beside the specific resistance, the cross-section of the interconnect can be increased in order to decrease the ohmic resistance. If the cross section of the interconnect is decreased, the resistance increases. Changing the cross-section of the interconnect may be performed either by changing its width or its height. The width of an interconnect must not necessarily be equal from its starting point to its end point. The interconnect may comprise a first portion having a first width and a second portion having a second width in order to adjust the resistance of the interconnect. In still another embodiment, the cross section of the interconnect can vary in several steps or continuously over its length.

The capacity of the interconnect is influenced strongly by its dimension and by the distance to neighboring conductive structures having a different voltage level during operation of the integrated circuit. These parameters may be changed also during chip design.

By designing the signal power delivered from driver circuit 11, the resistance R and the capacity C of the interconnect 13 to predetermined values, the delay of signals traveling from origin 10 to target block 12 may be adjusted during chip design to a predetermined value. This value may be generated by means of computer simulations of the chip design or obtained from measurements.

Figure 2:
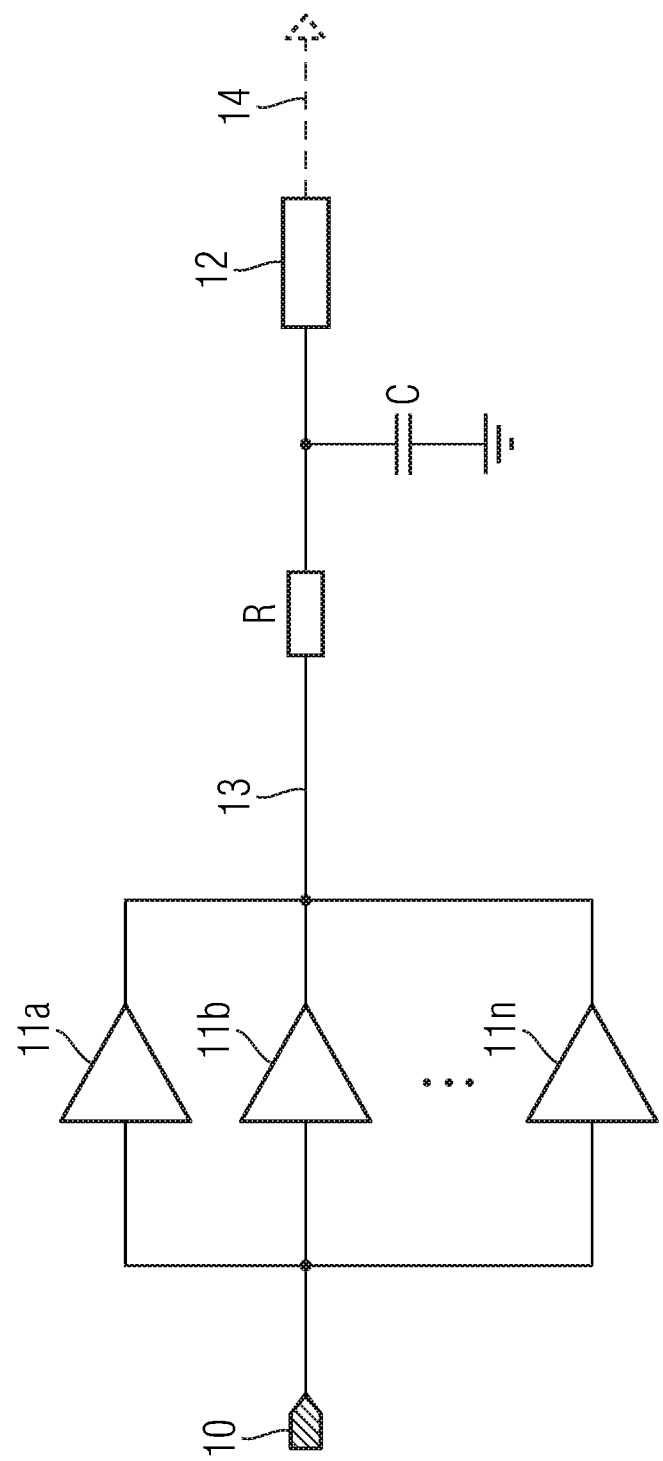
FIG. 2 shows a schematic diagram according to another embodiment.

FIG. 2 shows another embodiment of the invention. The embodiment according to FIG. 2 also involves a signal source 10. The signal may be lead by an interconnect 13 having a resistance R and a capacity C to a target block 12. Depending on the type of the target block, it may comprise an input and an output, wherein the input is coupled to interconnect 13 and the output is coupled to another interconnect 14. In this case, the target block 12 is a signal source for the next interconnect 14. It has to be noted that interconnect 14 is completely optional. There may be embodiments without interconnect 14.

The signal delay between the origin 10 and the target block 12 can be adjusted by varying the resistance R and the capacity C of interconnect 13 as described with respect to the embodiment detailed in FIG. 1.

In order to increase the signal power by use of driver circuit 11, a plurality of driver circuits 11a, 11b, ... 11n may be used. All driver circuits 11a, 11b, ... 11n may be arranged parallel to each other. This means, that the signal originating form signal source 10 may be supplied to the input of any of said driver circuits 11a, 11b, ... 11n. The signal power of the input signal may be increased by any of the driver circuits. Additionally, the output signal of at least two driver circuits 11a, 11b, ... 11n may be accumulated at the beginning of interconnect 13. By this measure, signal power may be enhanced compared to the signal power delivered by a single driver circuit 11. This signal with higher signal power may be capable of shorter signal delay during transport on interconnect 13.

Figure 3:
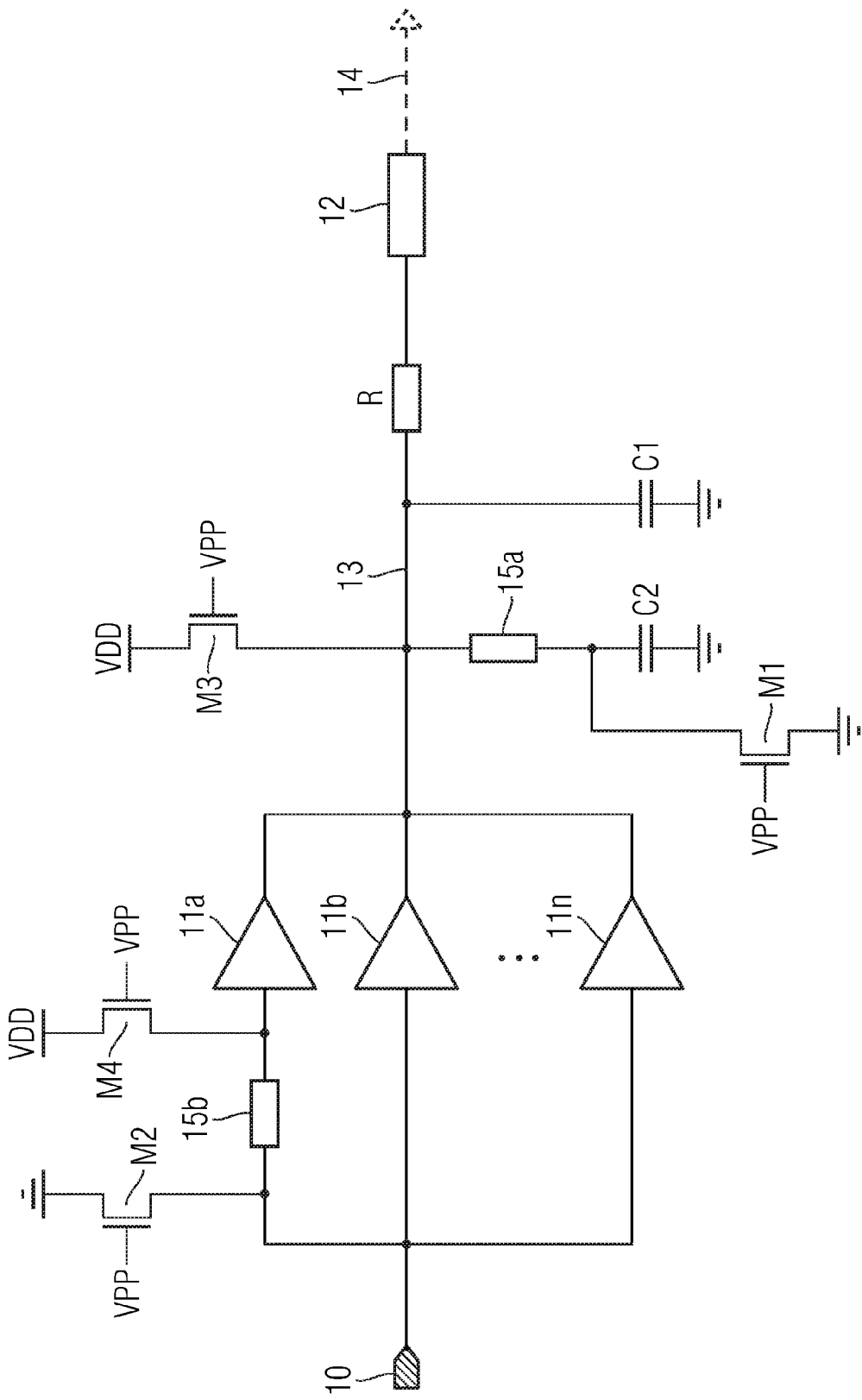
FIG. 3 shows another embodiment which involves components which are adjustable after manufacturing of the integrated circuit has been finished.

FIG. 3 shows still another embodiment of the invention. Also the embodiment according to FIG. 3 involves a plurality of driver circuits 11a, 11b, ... 11n. The input signal originating from input source 10 may be split up and delivered to the input of any of said driver circuits 11a, 11b, ... 11n. The number of driver circuits 11 may comprise at least 2. There may be a higher number of driver circuits 11, e. g. 3, 8, 12 or 16.

At least one driver circuit 11a is coupled with the signal source 10 by means of a fuse element 15b. The fuse element 15b may comprise an element made from conductive polycrystalline silicon. By applying a current to fuse element 15b, the fuse may blow and break the connection between the input of driver circuit 11a and signal source 10. After blowing fuse 15b, one driver circuit less is used for amplification of the input signal 10. Therefore, the signal delay between origin 10 and target block 12 increases.

Interconnect 13 may comprise an intrinsic resistance R and an intrinsic capacity C1. These intrinsic values are determining a basic delay of interconnect 13. This basic delay may be adjusted by changing the composition or geometry of interconnect 13 as described with respect to the embodiment in FIG. 1.

Furthermore, a capacity C2 may be built on the semiconductor die during manufacturing of the integrated circuit. The capacity C2 may be fabricated by arranging an insulator on a doped silicon substrate. The insulator may comprise an oxide or a nitride such as $SiO_x$ or $Si_xN_y$. A further conductive layer, such as a metal layer, may be arranged on said insulating layer. The metal layer may be coupled with the interconnect 13. This leads to an increased capacity of interconnect 13 which is given by the sum of capacities C1 and C2. Therefore, the delay of a signal traveling on interconnect 13 increases.

The embodiment detailed in FIG. 3 may be adapted to adjust the capacity of interconnect 13 after manufacturing of the integrated circuit. This adjustment can be done by switch M1, M3 and fuse element 15a. These elements are completely optional and may be omitted in case that adjustment of the delay of interconnect 13 is not necessary. To allow the adjustment, the capacitor C2 may be coupled with interconnect 13 by means of a second fuse element 15a. Fuse element 15a may be made from a conductive material with lower melting point or with smaller cross-section than the surrounding connections. As an example, fuse element 15a may be made from a polycrystalline silicon.

After manufacturing of the integrated circuit, the fuse element 15a may be conductive, i.e. has a low resistance. Therefore, the capacitor C2 is connected to the interconnect 13 and increases the signal delay.

In order to decrease the signal delay, the capacitor C2 may be removed from the signal path. This may be done by destroying fuse element 15a. This can be done by applying a high current during a short period of time which is sufficient to melt the fuse element 15a. To deliver such a current, two switching elements M3 and M1 may be used. As an example, a field-effect transistor may be used as a switching element. In another embodiment, the fuse element 15a may be connected by means of contact pads, so that the switching element is outside of the integrated circuit. By adding a programming voltage VPP to the gate electrodes of switching elements M1 and M3, a power source VDD may be connected to one end of the fuse element 15a. The other contact of fuse element 15a may be short-circuited to ground. This may result in a high current flowing through fuse element 15a and thereby melting the material from which fuse element 15a is made. As a result, fuse element 15a may feature a high ohmic resistance. This high ohmic resistance may result in capacity C2 being detached from interconnect 13.

In the same manner as described above, fuse element 15b arranged at the input of driver circuit 11a may be destroyed to decouple driver circuit 11a from the signal path. Destroying fuse element 15b may be performed by switching a voltage by means of switch M2 and M4. It has to be noted that fuse element 15b must not necessarily be connected to the input of driver circuit 11a. It may be re-arranged to the output of driver circuit 11a or to any other connection of the driver circuit such as the supply voltage of driver circuit 11a.

In order to adjust the delay in small steps, a plurality of capacitors coupled by means of fuse elements to the interconnect 13 may be provided. The effect of each capacitor may be compensated by an additional driver circuit 11 which by itself may be coupled to the input signal source 10 by means of a fuse element. By this measure, the signal delay on interconnect 13 may be increased stepwise by destroying the connections of the additional driver circuits one by one and it may be decreased by destroying the connection to a capacitor. The timing on the integrated circuit can thereby be adjusted in both directions and step-by-step in a broad range.

Although several embodiments of the invention have been illustrated in the accompanying drawings and described in the forgoing detailed description, it will be understood that the invention is not limited to the embodiments disclosed, but is capable of numerous rearrangements, modifications and substitutions without departing from the scope of the invention. In the foregoing description, numerous specific details have been set force. However, it is understood that embodiments of the invention may be practiced without these specific details. In other instances, well-known circuits, structures and techniques have not been shown in detail in order not to obscure the understanding of this description.

What is claimed is:

1. An integrated circuit comprising at least one signal path adapted to route at least one signal from an origin to a target block, said signal path comprising:
    a driver circuit comprising an input and an output, and adapted to receive an electric signal having a first signal power as an input signal at the input and further adapted to provide an electric signal having a second signal power as an output signal at the output;
    at least one interconnect having an ohmic resistance and an electric capacity and being adapted to route said electric signal having the second signal power to said target block;
    a capacitor, the capacitor being directly coupled to the at least one interconnect by a fuse; and
    a current source selectively coupled to the interconnect via a first switch, the current source configured to provide an electrical current to the fuse, wherein the fuse is blown when the electrical current melts the fuse, and wherein the capacitor is no longer directly coupled to the interconnect after the fuse is blown.

2. The integrated circuit according to claim 1, wherein said capacitor is arranged on a silicon substrate and comprises a metal layer having a first side and a second side and an oxide layer having a first side and a second side, wherein the second side of said oxide layer is arranged on a surface of said silicon substrate and the second side of said metal layer is arranged on the first side of said oxide layer.

3. An integrated circuit comprising at least one signal path adapted to route at least one signal from an origin to a target block, said signal path comprising:
    an adjustable driver circuit comprising an input and an output, and adapted to receive an electric signal having a first signal power as an input signal at the input and further adapted to provide an electric signal having a second signal power as an output signal at the output;
    at least one interconnect having an ohmic resistance and an electric capacity and being adapted to route said electric signal having the second signal power to said target block, wherein said adjustable driver circuit comprises at least two amplifiers which are arranged in parallel according to input signals and output signals of the amplifiers, and the output signal of each of said amplifiers is coupled to said interconnect;
    at least one of said at least two amplifiers is detachable from said interconnect by means of a fuse; and a current source configured to provide an electrical current to the fuse, wherein the fuse is blown when the electrical current melts the fuse.

4. The integrated circuit according to claim 1, wherein said interconnect comprises a structured layer made from any of a metal or a polycrystalline silicon or an alloy.

5. An integrated circuit comprising at least one signal path adapted to route at least one signal from an origin to a target block, said signal path comprising:
   an adjustable driver circuit comprising an input and an output, and adapted to receive an electric signal having a first signal power as an input signal at the input and further adapted to provide an electric signal having a second signal power as an output signal at the output, wherein said adjustable driver circuit comprises at least two amplifiers arranged in parallel according to input signals and output signals of the amplifiers and at least one of said at least two parallel amplifiers is detachable from at least one interconnect by means of a first fuse;
   said at least one interconnect having an ohmic resistance and an electric capacity and being adapted to route said electric signal having the second signal power to said target block;
   a capacitor coupled to said at least one interconnect by means of a second fuse; and
   a current source configured to provide an electrical current to the second fuse, wherein the second fuse is blown when the electrical current melts the second fuse.

6. A method for manufacturing an integrated circuit, said method comprising:
   providing at least one semiconductor substrate;
   forming an adjustable driver circuit comprising an input and an output on said substrate, and adapted to receive an electric signal having a first signal power as an input signal at the input and further adapted to provide an electric signal having a second signal power as an output signal at the output;
   forming a target block comprising at least one signal input on said substrate;
   forming at least one interconnect having an ohmic resistance and an electric capacity and extending at least from said output of said adjustable driver circuit to said input of said target block, wherein said adjustable driver circuit is formed by providing a plurality of amplifiers which are arranged in parallel according to input signals and output signals of the plurality of amplifiers, wherein the output signals of the plurality of amplifiers are coupled to the at least one interconnect;
   providing a fuse to disconnect the output signal of at least one amplifier out of the plurality of amplifiers from the at least one interconnect; and
   blowing the fuse by providing an electrical current that melts the fuse.

7. The method according to claim 6, further comprising:
   providing at least one capacitor which is coupled to said interconnect.

8. The method according to claim 7, further comprising:
   providing a fuse having a first contact and a second contact, wherein the first contact is coupled to one side of said capacitor and the second contact is coupled to said interconnect.

9. The method according to claim 6, wherein said interconnect is provided by:
   forming a layer comprising a conductive material;
   masking a first area of said layer and a second layer of said area, wherein the first area forms the interconnect; and
   removing said second masked area of said layer.

10. The method according to claim 9, wherein said layer comprising a conductive material comprises any of a metal, an alloy or polycrystalline silicon.

11. The method according to claim 9, wherein a thickness of said layer and a dimension of said first area is chosen such that a value of the ohmic resistance of said interconnect amounts to a predetermined value.

12. The method according to claim 9, wherein a dimension of said first area is chosen such that a value of the electric capacity of said interconnect amounts to a predetermined value.

13. A method for manufacturing an integrated circuit, said method comprising:
   providing at least one semiconductor substrate;
   forming an adjustable driver circuit comprising an input and an output on said substrate, adapted to receive an electric signal having a first signal power as an input signal at the input and further adapted to provide an electric signal having a second signal power as an output signal at the output, wherein said driver circuit comprises amplifiers which are arranged in parallel according to input signals and output signals of the amplifiers, wherein the output signals of said amplifiers are coupled to at least one interconnect, wherein the output signal of at least one of the amplifiers is coupled to the at least one interconnect by means of a first fuse;
   forming a target block comprising at least one signal input on said substrate;
   forming the at least one interconnect having an ohmic resistance and an electric capacity and extending at least from the output of said driver circuit to said input of said target block;
   providing at least one capacitor which is coupled to the at least one interconnect by means of a second fuse; and
   breaking at least one of the first and second fuses by providing an electrical current that melts the at least one of the first and second fuses in order to adjust a signal delay.

14. The method according to claim 13, wherein said at least one of the first and second fuses is broken by connecting a current source to said at least one of the first and second fuses to provide the electrical current.

15. The integrated circuit according to claim 1, further comprising a second switch coupled between ground and a node located between the fuse and the capacitor, wherein the second switch is closed when the electrical current from the current source melts the fuse.

16. The integrated circuit according to claim 15, further comprising a switch signal that synchronizes the opening and closing of the first and second switches.

17. The integrated circuit according to claim 3, further comprising a first switch between the current source and the fuse, the first switch controlling whether the electrical current is provided to the fuse.

18. The integrated circuit according to claim 17, wherein the fuse is located between at least one of the amplifiers and a shared node of the amplifiers, and further comprising, a second switch coupled between ground and a node that is located between at least one of: (i) the shared node and the fuse and (ii) the fuse and the at least one of the amplifiers.

19. The method claim 6, wherein blowing the fuse by providing the electrical current comprises activating a switch located between the fuse and a current source, wherein the current source provides the electrical current.

20. The method claim 13, wherein breaking the at least one of the first and second fuses by providing the electrical current comprises activating a switch located between the at least one of the first and second fuses and a current source, wherein the current source provides the electrical current.

\* \* \* \* \*